US012763741B2

(12) United States Patent
Ningrat et al.

(10) Patent No.: US 12,763,741 B2
(45) Date of Patent: Oct. 13, 2026

(54) ANALOG FRONT-END CIRCUIT AND TOUCH-SENSING CIRCUIT

(71) Applicant: Kunshan Yunyinggu Electronic Technology Co., Ltd., Kunshan (CN)

(72) Inventors: Kusuma Adi Ningrat, Malang (ID); Hanif Fakhruddin, Malang (ID)

(73) Assignee: Kunshan Yunyinggu Electronic Technology Co., Ltd., Kunshan (CN)

( * ) Notice: Subject to any disclaimer, the term of this patent is extended or adjusted under 35 U.S.C. 154(b) by 523 days.

(21) Appl. No.: 18/137,663

(22) Filed: Apr. 21, 2023

(65) Prior Publication Data

US 2024/0356506 A1 Oct. 24, 2024

(51) Int. Cl.

*H03F 3/45* (2006.01)
*G06F 3/041* (2006.01)
*H03F 1/26* (2006.01)
*H03F 3/00* (2006.01)
*H03F 3/70* (2006.01)

(52) U.S. Cl.

CPC ..... *H03F 3/45475* (2013.01); *G06F 3/04182* (2019.05); *H03F 1/26* (2013.01); *H03F 3/005* (2013.01); *H03F 3/70* (2013.01); *H03F 2200/264* (2013.01); *H03F 2203/45136* (2013.01); *H03F 2203/45174* (2013.01); *H03F 2203/45512* (2013.01); *H03F 2203/45526* (2013.01); *H03F 2203/45528* (2013.01); *H03F 2203/45551* (2013.01)

(58) Field of Classification Search

CPC ........ H03F 3/45475; H03F 1/26; H03F 3/005; H03F 2203/45551; H03F 2203/45136; H03F 2203/45526; H03F 2203/45528; H03F 2203/45512; H03F 3/70; H03F 2200/264; H03F 2203/45174; G06F 3/04182

USPC .............................................................. 330/9

See application file for complete search history.

(56) References Cited

U.S. PATENT DOCUMENTS

| | | | | |
|---|---|---|---|---|
| 9,244,569 B2 * | 1/2016 | Guedon | G06F 3/0446 | |
| 9,437,169 B2 * | 9/2016 | Noto | G09G 5/18 | |
| 11,079,878 B1 * | 8/2021 | Krah | H03H 7/06 | |
| 11,747,939 B1 * | 9/2023 | Wu | G06F 3/04166 | 345/173 |
| 2011/0063154 A1 * | 3/2011 | Hotelling | H03M 3/494 | 341/143 |
| 2011/0102061 A1 * | 5/2011 | Wang | G06F 3/0446 | 327/517 |
| 2018/0191312 A1 * | 7/2018 | Mu | H04B 1/1638 | |

FOREIGN PATENT DOCUMENTS

| | | | | |
|---|---|---|---|---|
| CN | 115562513 A * | 1/2023 | G06F 3/041662 |
| EP | 3144790 B1 * | 2/2019 | G06F 3/0446 |
| WO | WO-9807110 A1 * | 2/1998 | H03F 3/082 |

* cited by examiner

*Primary Examiner* — Andrea Lindgren Baltzell
*Assistant Examiner* — Lance Torbjorn Bartol
(74) *Attorney, Agent, or Firm* — Bayes PLLC

(57) ABSTRACT

An analog front-end circuit includes a reference voltage source, a first capacitor, an amplifier, and a second capacitor. The first capacitor is coupled to the reference voltage source through a switch. The amplifier includes a first input end receiving a touch sensing signal from a touch sensor, a second input end receiving a reference signal from the first capacitor, and an output end outputting an output signal. The second capacitor is disposed between the first input end and the second input end.

20 Claims, 7 Drawing Sheets

400

300

400

500

700

ANALOG FRONT-END CIRCUIT AND TOUCH-SENSING CIRCUIT

BACKGROUND

The present disclosure relates to an analog front-end (AFE) circuit, and particularly, to a touch AFE circuit that reduces the noise interference of the display panel.

When using metal materials to replace the transparent material in the touch panel, the touch panel needs to be placed as close to the display panel as possible to have a better display performance. However, the noise interference from the display panel may cause errors in the touch signals.

SUMMARY

In one aspect, an analog front-end circuit is disclosed. The analog front-end circuit includes a reference voltage source, a first capacitor, an amplifier, and a second capacitor. The first capacitor is coupled to the reference voltage source through a switch. The amplifier includes a first input end receiving a touch sensing signal from a touch sensor, a second input end receiving a reference signal from the first capacitor, and an output end outputting an output signal. The second capacitor is disposed between the first input end and the second input end.

In some implementations, the analog front-end circuit further includes a third capacitor disposed between the first input end and the touch sensor.

In some implementations, the analog front-end circuit further includes a fourth capacitor disposed between the first input end and a display panel.

In some implementations, the analog front-end circuit further includes a fifth capacitor disposed between the first input end and the output end, a sixth capacitor disposed between the first input end and the third capacitor, and a first resistor disposed between the output end and the third capacitor.

In some implementations, the sixth capacitor includes a first terminal coupled to the first input end and the fourth capacitor, and a second terminal coupled to the first resistor, the second capacitor, and the third capacitor.

In some implementations, a capacitance of the fifth capacitor is between 0.1 pF and 5 pF, and a capacitance of the sixth capacitor is between 0.1 pF and 5 pF.

In some implementations, a capacitance ratio of the fifth capacitor and the sixth capacitor is between 0.1 and 5.

In some implementations, a capacitance of the first capacitor is between 1 pF and 200 pF, and a capacitance of the second capacitor is between 50 fF and 5 pF.

In some implementations, the analog front-end circuit further includes a first resistor disposed between the output end and the third capacitor, a second resistor disposed between the first input end and the output end, and a third resistor disposed between the first input end and the third capacitor.

In some implementations, the third resistor includes a first terminal coupled to the first input end and the second resistor, and a second terminal coupled to the first resistor, the second capacitor, and the third capacitor.

In some implementations, a resistance of the second resistor is between 200 ohms and 4000 ohms, and a resistance of the third resistor is between 200 ohms and 4000 ohms.

In some implementations, a resistance ratio of the second resistor and the third resistor is between 0.1 and 5.

In some implementations, the analog front-end circuit further includes an integrator circuit. The integrator circuit includes a first integrator input end coupled to the output end of the amplifier, a second integrator input end coupled to the reference voltage source, and an integrator output end.

In some implementations, the analog front-end circuit further includes a fourth resistor disposed between the first integrator input end and the output end of the amplifier, and a seventh capacitor disposed between the first integrator input end and the integrator output end.

In another aspect, a touch-sensing circuit is disclosed. The touch-sensing circuit includes an analog front-end circuit, an integrator circuit, and an analog-to-digital converter.

The analog front-end circuit includes a reference voltage source, a first capacitor, an amplifier, and a second capacitor. The first capacitor is coupled to the reference voltage source through a switch. The amplifier includes a first input end receiving a touch sensing signal from a touch sensor, a second input end receiving a reference signal from the first capacitor, and an output end outputting an output signal. The second capacitor is disposed between the first input end and the second input end. The integrator circuit includes a first integrator input end coupled to the output end of the amplifier, a second integrator input end coupled to the reference voltage source, and an integrator output end. The analog-to-digital converter is coupled to the integrator output end.

In some implementations, the analog front-end circuit further includes a third capacitor disposed between the first input end and the touch sensor, and a fourth capacitor disposed between the first input end and a display panel.

In some implementations, the analog front-end circuit further includes a fifth capacitor disposed between the first input end and the output end, a sixth capacitor disposed between the first input end and the third capacitor, and a first resistor disposed between the output end and the third capacitor.

In some implementations, the sixth capacitor includes a first terminal coupled to the first input end and the fourth capacitor, and a second terminal coupled to the first resistor, the second capacitor, and the third capacitor.

In some implementations, the analog front-end circuit further includes a first resistor disposed between the output end and the third capacitor, a second resistor disposed between the first input end and the output end, and a third resistor disposed between the first input end and the third capacitor.

In some implementations, the integrator circuit further includes a fourth resistor disposed between the first integrator input end and the output end of the amplifier, and a seventh capacitor disposed between the first integrator input end and the integrator output end.

BRIEF DESCRIPTION OF THE DRAWINGS

The accompanying drawings, which are incorporated herein and form a part of the specification, illustrate implementations of the present disclosure and, together with the description, further serve to explain the present disclosure and to enable a person skilled in the pertinent art to make and use the present disclosure.

Figure 1:
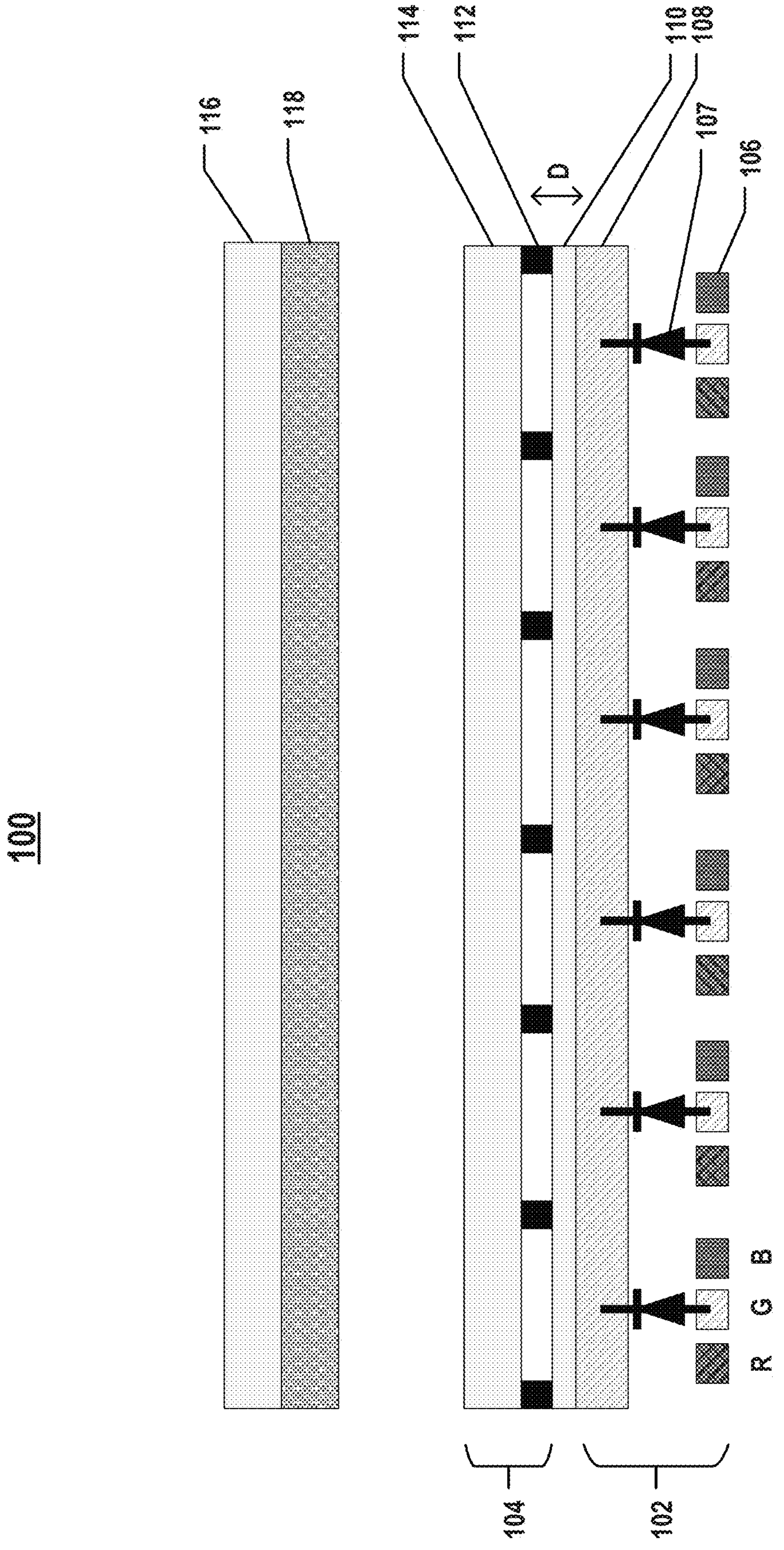
FIG. 1 illustrates a schematic view of a cross-section of a display panel and a touch panel, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosures.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for the existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "coupled to" or "connected to" refers to the electrical connection between two circuit nodes or the direct connection between two circuit nodes. The connection may be made through other devices or wires, such as conductive lines, capacitors, resistors, transistors, conductors, amplifiers, or any capable devices. The connection may also be made through direct wiring. The term "capacitor" refers to a physical capacitor, a parasitic capacitance, a sensing capacitance, or any other suitable device.

FIG. 1 illustrates a schematic view of a cross-section of a touch display 100 formed by a display panel 102 and a touch panel 104, according to some aspects of the present disclosure. As shown in FIG. 1, display panel 102 may include an anode layer 106, a light-emitting element 107, and a cathode layer 108. In some implementations, display panel 102 may be an organic light-emitting diode (OLED) display. In some implementations, light-emitting element 107 may be formed by several intermediate layers, such as the electron transport layer, the blocking layer, the emissive layer, the hole transport layer, and the hole injection layer. In some implementations, anode layer 106 and cathode layer 108 may be formed on the bottom and the top of the intermediate layers for driving display panel 102.

In some implementations, touch panel 104 may include a metal mesh layer 112 and a protective layer 114 for sensing the touch operations of the users. In some implementations, metal mesh layer 112 may be formed of indium tin oxide (ITO), indium zinc oxide (IZO), zinc oxide (ZnO), indium oxide (In2O3), indium gallium oxide (IGO), and/or aluminum zinc oxide (AZO). In some implementations, display panel 102 may be a foldable active-matrix organic light-emitting diode (AMOLED), and metal mesh layer 112 may be formed of indium gallium oxide (IGO). In some implementations, touch display 100 may further include an overlay glass 116 and an optically clear adhesive (OCA) layer 118 for bonding overlay glass 116 to touch panel 104.

Figure 2:
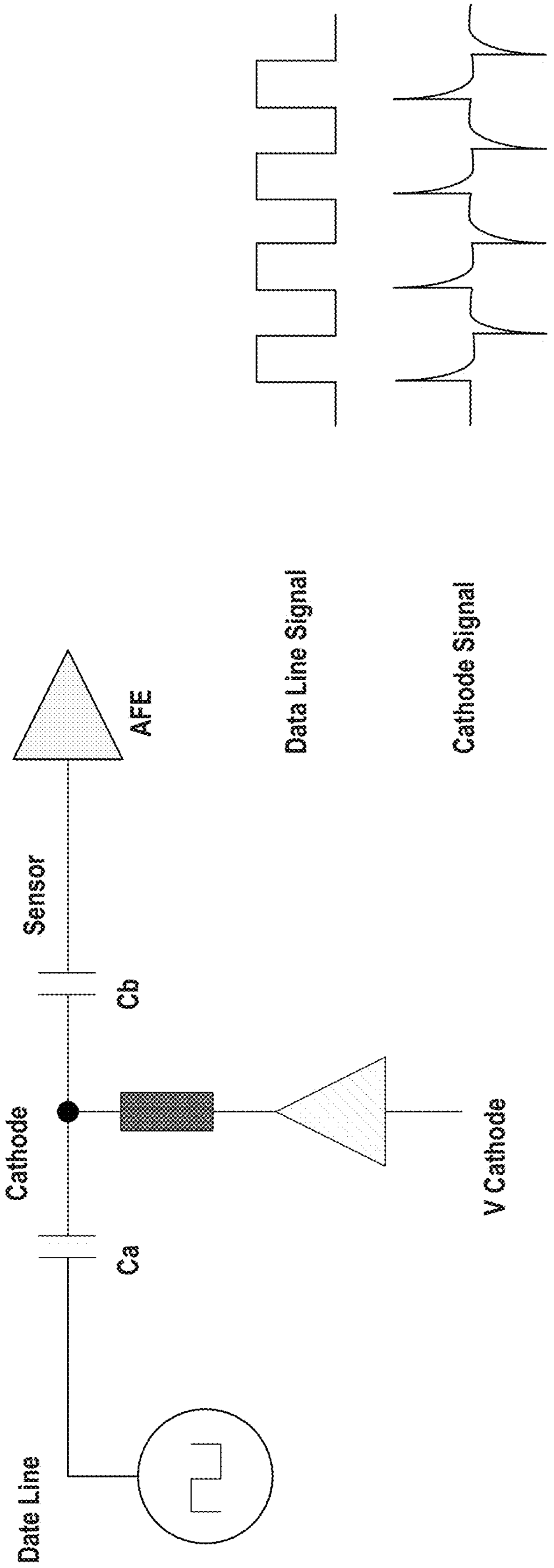
FIG. 2 illustrates a schematic view showing noise interference from the display panel to the analog front-end circuit, according to some aspects of the present disclosure.

FIG. 2 illustrates a schematic view showing noise interference from display panel 102 to the analog front-end (AFE) circuit of touch panel 104, according to some aspects of the present disclosure. In some implementations, display panel 102 and touch panel 104 may be insulated by an insulator 110. In some implementations, the distance between metal mesh layer 112 of touch panel 104 and cathode layer 108 of display panel 102 may be formed very close, for example, between 4-12 um. As shown in FIG. 2, during the operation of display panel 102, the data line signal may be applied to the data lines, e.g., anode layer 106. The capacitor Ca is formed between anode layer 106 and cathode layer 108, and the capacitor Cb is formed between cathode layer 108 and touch panel 104, e.g., metal mesh layer 112. In some implementations, for example, the capacitor Cb may be as large as 500 pF, the noise induced by the data lines of display panel 102 may be as large as 1 volt (V), and the charge injected by the display noise to touch panel 104 may be around 500 pC per data line. In some implementations, the mutual capacitance change in touch panel 104 may be in a range of 50 fF to 150 fF, and the self capacitance change in touch panel 104 may be in a range of 50 fF to 200 fF. When the measure signal voltage of touch panel 104 is as high as 6 volts, the charge injected by metal mesh layer 112 to AFE circuit could be 900 fC. Comparing the charge injected by metal mesh layer 112 and the display noise, the AFE circuit needs to be able to amplify the touch panel signal for the analog-to-digital converter (ADC) without being clipped by the huge display noise.

Figure 3:
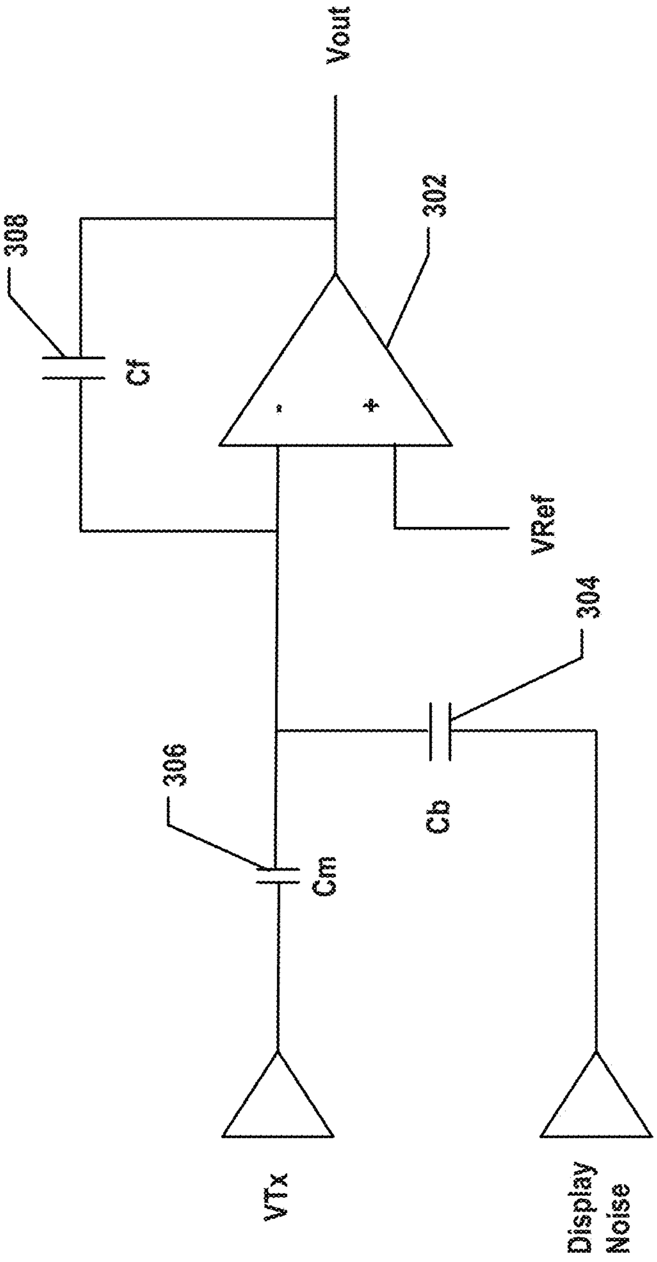
FIG. 3 illustrates a schematic view of an exemplary analog front-end circuit, according to some aspects of the present disclosure.

FIG. 3 illustrates a schematic view of an exemplary analog front-end circuit 300, according to some aspects of the present disclosure. As shown in FIG. 3, analog front-end circuit 300 may include an operational amplifier 302. A touch sensing signal VTx from a touch sensor of touch panel 104 and a display noise signal are provided to a first input end of operational amplifier 302. Further, a fixed reference voltage source Vref is provided to a second input end of operational amplifier 302. The capacitor 304 (Cb) is formed between cathode layer 108 and touch panel 104, the capacitor 306 (Cm) is the mutual capacitance to be measured, and the capacitor 308 (Cf) is the charge amplifier feedback capacitance. In some implementations, the voltage Vout at an output end of operational amplifier 302 may be represented as Vout=(−Cm/Cf×VTx).

However, in some implementations, since the capacitance of capacitor 304 is huge comparing capacitor 306, the display noise from capacitor 304 may cause a poor signal-to-noise ratio (SNR), and analog front-end circuit 300 may easily hit the maximum or the minimum working range.

Figure 4:
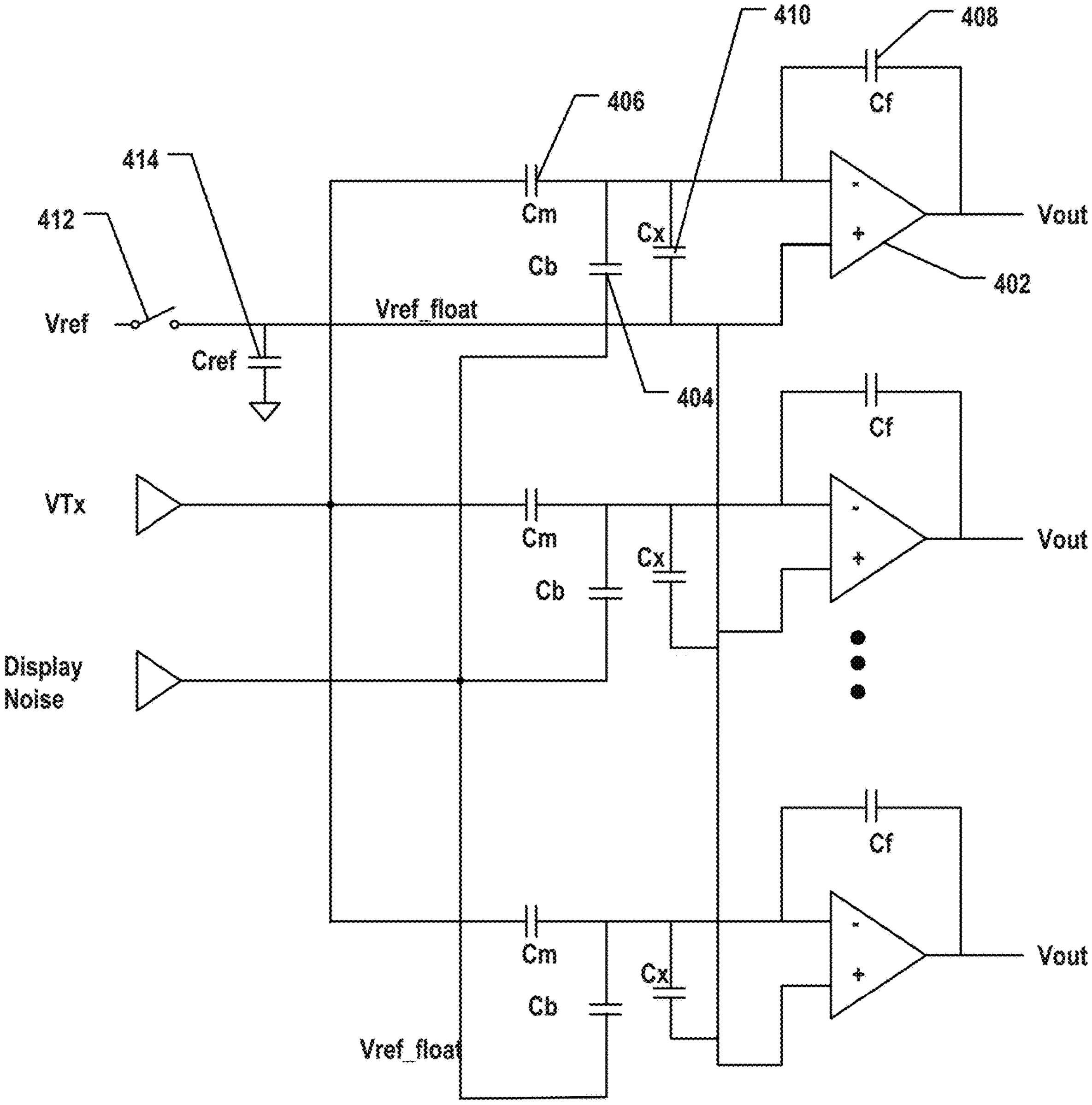
FIG. 4 illustrates a schematic view of an exemplary analog front-end circuit, according to some aspects of the present disclosure.

FIG. 4 illustrates a schematic view of an exemplary analog front-end circuit 400, according to some aspects of the present disclosure. As shown in FIG. 4, analog front-end circuit 400 includes an operational amplifier 402. A touch sensing signal VTx from a touch sensor of touch panel 104 and a display noise signal are provided to a first input end of operational amplifier 402. Further, a reference voltage source Vref is provided to a second input end of operational amplifier 402. The capacitor 404 (Cb) is formed between cathode layer 108 and touch panel 104, the capacitor 406 (Cm) is the mutual capacitance to be measured, and the capacitor 408 (Cf) is the charge amplifier feedback capacitance.

A reference capacitor 414 (Cref) is coupled to the reference voltage source Vref through a switch 412. A sampling capacitor 410 (Cx) is disposed between the first input end and the second input end of operational amplifier 402. In some implementations, switch 412 may be initially closed, and reference voltage source Vref may charge reference capacitor 414 to a voltage Vref_float. Then, switch 412 may be opened, and reference capacitor 414 may be left floating having a voltage Vref_float. When sampling capacitor 410 samples the voltage at the first input end of operational amplifier 402, sampling capacitor 410 may feed it to reference capacitor 414 having a voltage Vref_float. The voltage at reference capacitor 414 may move the same way as the voltage sampled at the first input end of operational amplifier 402, and the noise interference to the output voltage Vout at the output end of operational amplifier 402 may be minimized.

Figure 5:
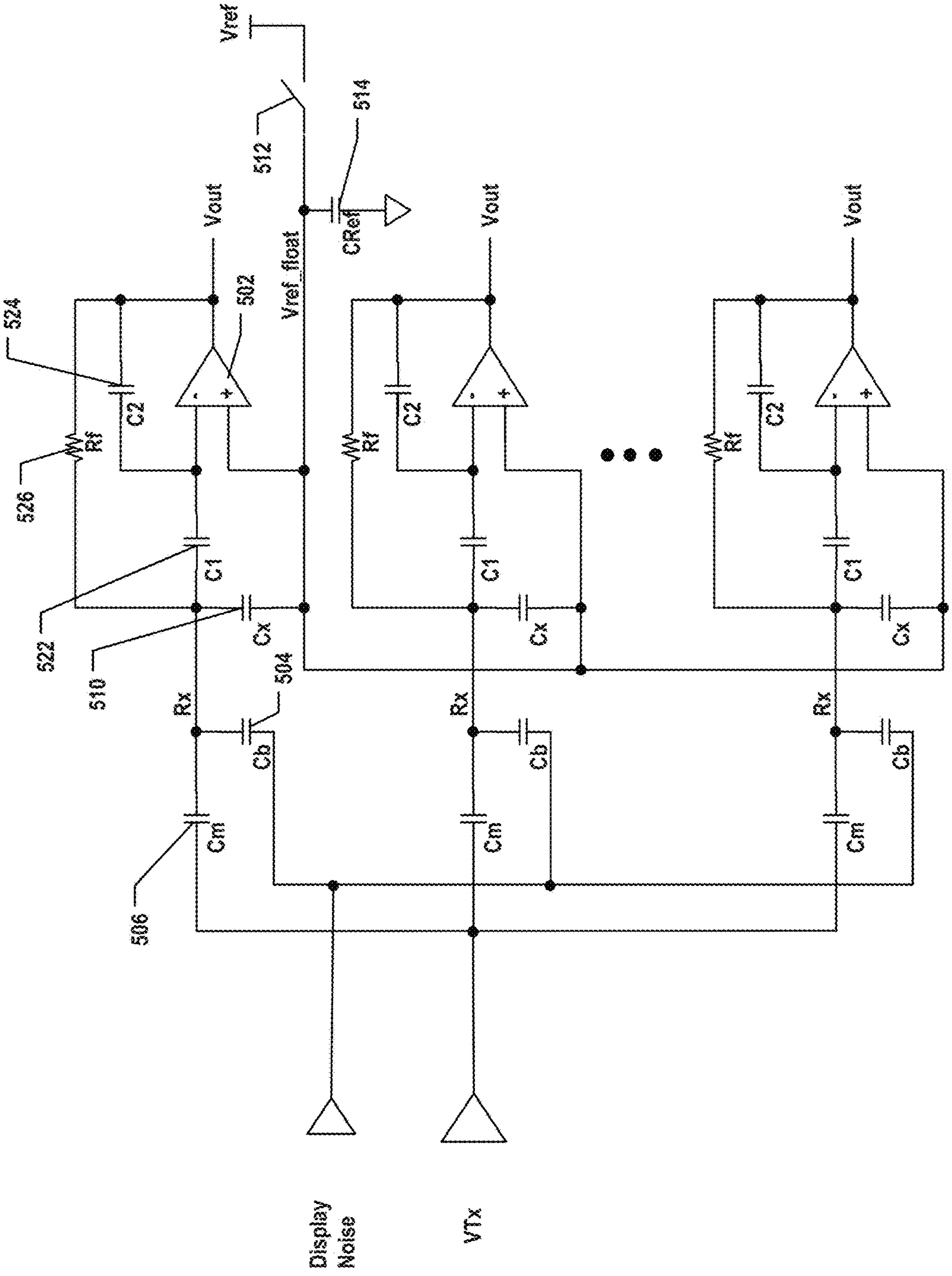
FIG. 5 illustrates a schematic view of an exemplary analog front-end circuit, according to some aspects of the present disclosure.

FIG. 5 illustrates a schematic view of an exemplary analog front-end circuit 500, according to some aspects of the present disclosure. As shown in FIG. 5, analog front-end circuit 500 includes an operational amplifier 502. A touch sensing signal VTx from a touch sensor of touch panel 104 and a display noise signal are provided to a first input end of operational amplifier 502. Further, a reference voltage source Vref is provided to a second input end of operational amplifier 502. The capacitor 504 (Cb) is formed between cathode layer 108 and touch panel 104, and the capacitor 506 (Cm) is the mutual capacitance to be measured. A reference capacitor 514 (Cref) is coupled to the reference voltage source Vref through a switch 512. A sampling capacitor 510 (Cx) is disposed between the first input end and the second input end of operational amplifier 502.

As shown in FIG. 5, a capacitor 522 (C1) is disposed between the first input end of operational amplifier 502 and sampling capacitor 510, a capacitor 524 (C2) is disposed between the first input end and the output end of operational amplifier 502, and a feedback resistor 526 (Rf) is disposed between the output end of operational amplifier 502 and sampling capacitor 510.

In some implementations, capacitor 522 (C1) and capacitor 524 (C2) are used as an operational amplifier gain scaler to control the gain of operational amplifier 502 by the ratio of C1/C2. In some implementations, the capacitance of capacitor 522 may be between 0.1 pF and 5 pF. In some implementations, the capacitance of capacitor 522 may be between 0.5 pF and 2 pF. In some implementations, the capacitance of capacitor 524 may be between 0.1 pF and 5 pF. In some implementations, the capacitance of capacitor 524 may be between 0.5 pF and 2 pF. In some implementations, the capacitance ratio of capacitor 522 and capacitor 524 (C1/C2) may be controlled between 0.1 and 5. In some implementations, the capacitance ratio of capacitor 522 and capacitor 524 (C1/C2) may be controlled between 0.5 and 2. In some implementations, the capacitance of reference capacitor 514 may be between 1 pF and 200 pF. In some implementations, the capacitance of reference capacitor 514 may be between 2 pF and 100 pF. In some implementations, the capacitance of sampling capacitor 510 may be between 50 fF and 5 pF. In some implementations, the capacitance of sampling capacitor 510 may be between 100 fF and 2 pF. Feedback resistor 526 is used to regulate the voltage of the touch sensor of touch panel 104 at the node Rx.

In some implementations, when the display noise is common to all channels, the output voltage Vout at the output end of operational amplifier 502 may be controlled to stay at Vref or close to Vref, and therefore the noise interference to the output voltage Vout at the output end of operational amplifier 502 may be minimized.

Figure 6:
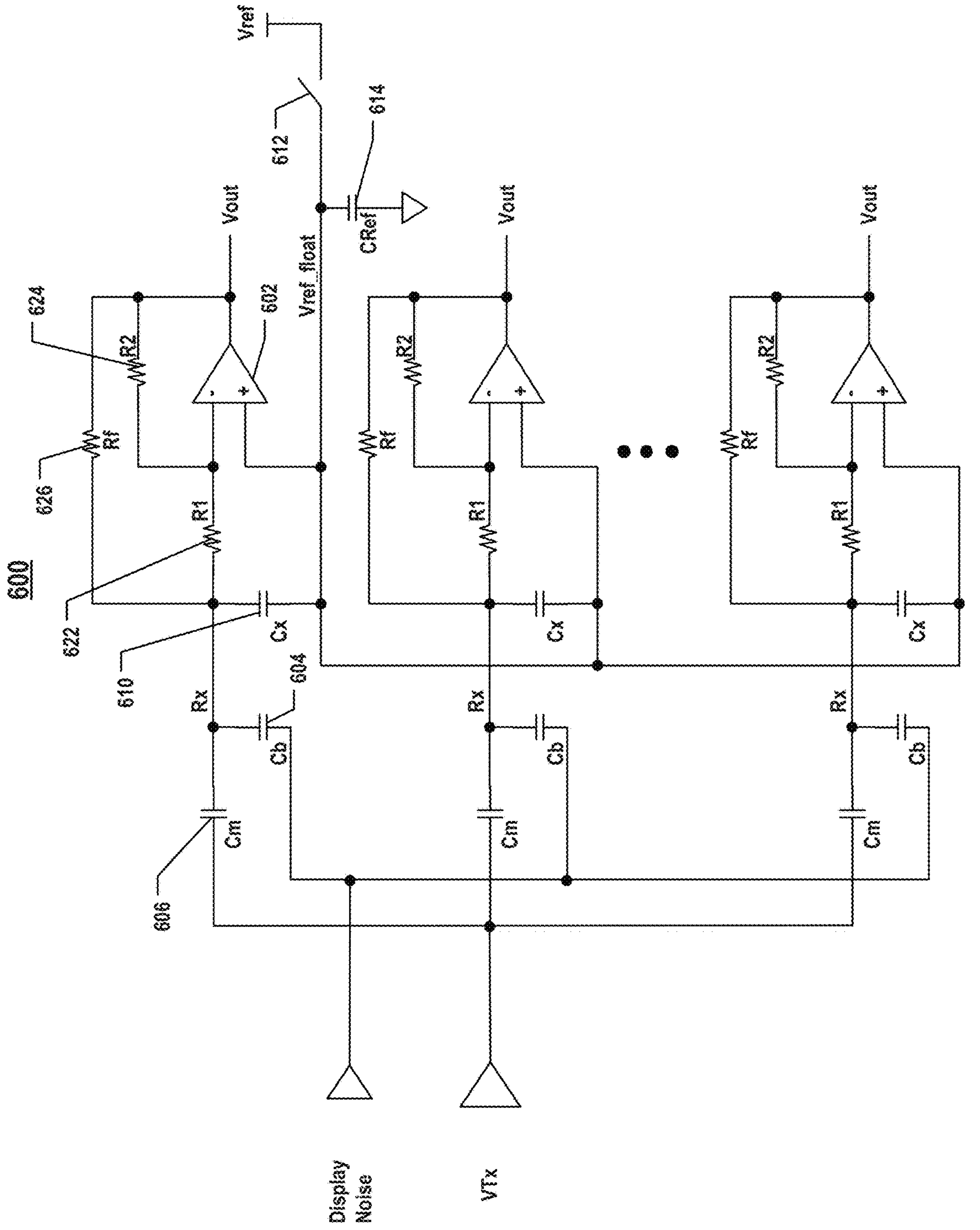
FIG. 6 illustrates a schematic view of an exemplary analog front-end circuit, according to some aspects of the present disclosure.

FIG. 6 illustrates a schematic view of an exemplary analog front-end circuit 600, according to some aspects of the present disclosure. As shown in FIG. 6, analog front-end circuit 600 includes an operational amplifier 602. A touch sensing signal VTx from a touch sensor of touch panel 104 and a display noise signal are provided to a first input end of operational amplifier 602. Further, a reference voltage source Vref is provided to a second input end of operational amplifier 602. The capacitor 604 (Cb) is formed between cathode layer 108 and touch panel 104, and the capacitor 606 (Cm) is the mutual capacitance to be measured. A reference capacitor 614 (Cref) is coupled to the reference voltage source Vref through a switch 612. A sampling capacitor 610 (Cx) is disposed between the first input end and the second input end of operational amplifier 602.

As shown in FIG. 6, a resistor 622 (R1) is disposed between the first input end of operational amplifier 602 and sampling capacitor 610, a resistor 624 (R2) is disposed between the first input end and the output end of operational amplifier 602, and a feedback resistor 626 (Rf) is disposed between the output end of operational amplifier 602 and sampling capacitor 610.

In some implementations, resistor 622 (R1) and resistor 624 (R2) are used as an operational amplifier gain scaler to control the gain of operational amplifier 602 by the ratio of R1/R2. In some implementations, the resistance of resistor 622 may be between 200 ohms and 4000 ohms. In some implementations, the resistance of resistor 622 may be between 500 ohms and 2000 ohms. In some implementations, the resistance of resistor 624 may be between 200 ohms and 4000 ohms. In some implementations, the resistance of resistor 624 may be between 500 ohms and 2000 ohms. In some implementations, the resistance ratio of resistor 622 and resistor 624 (R1/R2) may be controlled between 0.1 and 5. In some implementations, the resistance ratio of resistor 622 and resistor 624 (R1/R2) may be controlled between 0.5 and 2.

In some implementations, the capacitance of reference capacitor 614 may be between 1 pF and 200 pF. In some implementations, the capacitance of reference capacitor 614 may be between 2 pF and 100 pF. In some implementations, the capacitance of sampling capacitor 610 may be between 50 fF and 5 pF. In some implementations, the capacitance of sampling capacitor 610 may be between 100 fF and 2 pF. Feedback resistor 626 is used to regulate the voltage of the touch sensor of touch panel 104 at the node Rx.

In some implementations, when the display noise is common to all channels, the output voltage Vout at the output end of operational amplifier 602 may be controlled to stay at Vref or close to Vref, and therefore the noise interference to the output voltage Vout at the output end of operational amplifier 602 may be minimized.

Figure 7:
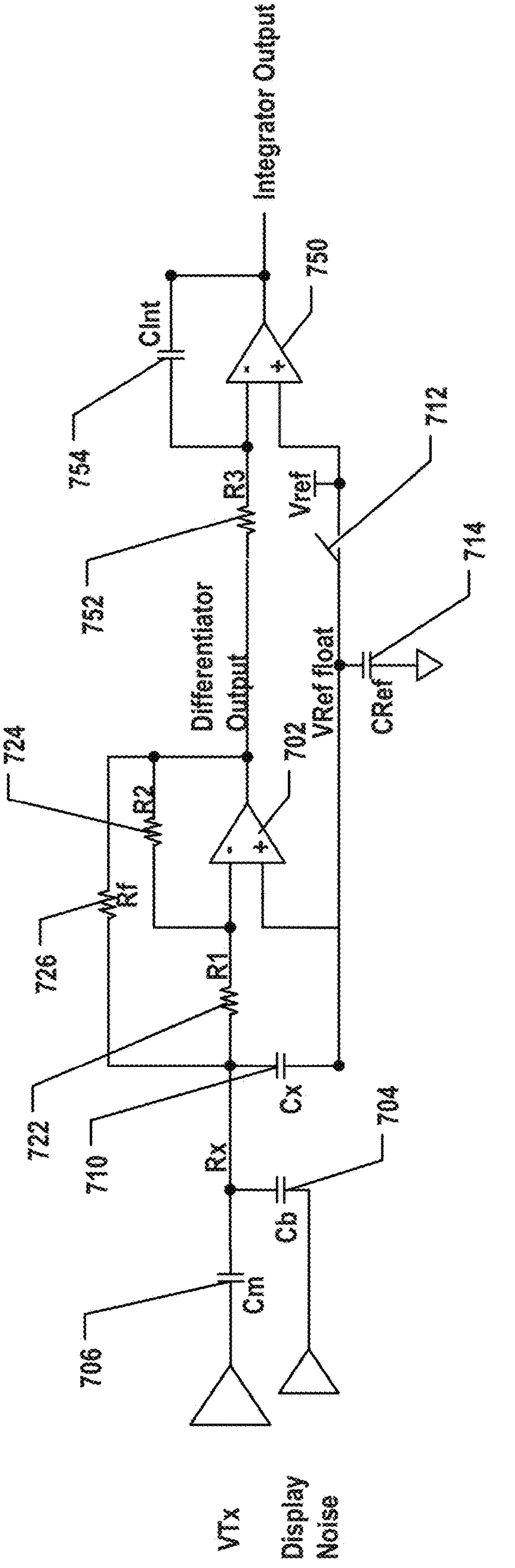
FIG. 7 illustrates a schematic view of an exemplary analog front-end circuit, according to some aspects of the present disclosure.

FIG. 7 illustrates a schematic view of an exemplary analog front-end circuit 700, according to some aspects of the present disclosure. In some implementations, since analog front-end circuits 400, 500, and/or 600 may act as a differentiator circuit of the input signals in the touch sensing circuit, an integrator may be needed at the output end of analog front-end circuits 400, 500, and/or 600 to recover the signals. The differentiator circuit may be similar to analog front-end circuits 400, 500, and/or 600, and analog front-end circuit 600 is used as the differentiator circuit in FIG. 7 as an example.

As shown in FIG. 7, analog front-end circuit 700 includes an operational amplifier 702. A touch sensing signal VTx from a touch sensor of touch panel 104 and a display noise signal are provided to a first input end of operational amplifier 702. Further, a reference voltage source Vref is provided to a second input end of operational amplifier 702. The capacitor 704 (Cb) is formed between cathode layer 108 and touch panel 104, and the capacitor 706 (Cm) is the mutual capacitance to be measured. A reference capacitor 714 (Cref) is coupled to the reference voltage source Vref through a switch 712. A sampling capacitor 710 (Cx) is disposed between the first input end and the second input end of operational amplifier 702.

As shown in FIG. 7, a resistor 722 (R1) is disposed between the first input end of operational amplifier 702 and sampling capacitor 710, a resistor 724 (R2) is disposed between the first input end and the output end of operational amplifier 702, and a feedback resistor 726 (Rf) is disposed between the output end of operational amplifier 702 and sampling capacitor 710.

In some implementations, resistor 722 (R1) and resistor 724 (R2) are used as an operational amplifier gain scaler to control the gain of operational amplifier 702 by the ratio of R1/R2. In some implementations, the resistance of resistor 722 may be between 200 ohms and 4000 ohms. In some implementations, the resistance of resistor 722 may be between 500 ohms and 2000 ohms. In some implementations, the resistance of resistor 724 may be between 200 ohms and 4000 ohms. In some implementations, the resistance of resistor 724 may be between 500 ohms and 2000 ohms. In some implementations, the resistance ratio of resistor 722 and resistor 724 (R1/R2) may be controlled between 0.1 and 5. In some implementations, the resistance ratio of resistor 722 and resistor 724 (R1/R2) may be controlled between 0.5 and 2.

In some implementations, the capacitance of reference capacitor 714 may be between 1 pF and 200 pF. In some implementations, the capacitance of reference capacitor 714 may be between 2 pF and 100 pF. In some implementations, the capacitance of sampling capacitor 710 may be between 50 fF and 5 pF. In some implementations, the capacitance of sampling capacitor 710 may be between 100 fF and 2 pF. Feedback resistor 726 is used to regulate the voltage of the touch sensor of touch panel 104 at the node Rx.

As shown in FIG. 7, analog front-end circuit 700 may further include the integrator circuit. In some implementations, analog front-end circuit 700 may further include an operational amplifier 750, a resistor 752 (R3) disposed between the output end of operational amplifier 702 and a first input end of operational amplifier 750, and a capacitor 754 disposed between the first input end and an output end of operational amplifier 750. Reference voltage source Vref is provided to a second input end of operational amplifier 750.

As shown in FIG. 7, the output end of operational amplifier 702 may have a differentiator output. When the display noise is common to all channels, the output voltage Vout at the output end of operational amplifier 702 may be controlled to stay at Vref or close to Vref. In other words, the floating reference input voltage applied to the differentiator circuit may suppress the common signals across channels. The integrator circuit may be used to integrate the output signal of the differentiator circuit. In this situation, touch sensing signal VTx through capacitor 706 (Cm) may be suppressed by the differentiator circuit, but if there is a local change to capacitor 706 (Cm) due to the finger touch, the difference will be visible at the output end of the integrator circuit, e.g., the output end of operational amplifier 750. Hence, the noise interference to the output voltage at the output end of operational amplifier 750 may be minimized.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. An analog front-end circuit, comprising:
- a reference voltage source;
- a first capacitor coupled to the reference voltage source through a switch;
- an amplifier, comprising:
  - a first input end receiving a touch sensing signal from a touch sensor;
  - a second input end receiving a reference signal from the first capacitor; and
- an output end outputting an output signal;
- a second capacitor disposed between the first input end and the second input end;
- a third capacitor disposed between the first input end and the touch sensor;
- a fourth capacitor disposed between the first input end and a display panel;
- a fifth capacitor disposed between the first input end and the output end;
- a sixth capacitor comprising a first terminal coupled to the first input end and the fifth capacitor and a second terminal coupled to all of a first resistor, the second capacitor, the third capacitor, and the fourth capacitor; and
- the first resistor disposed between the output end and the third capacitor.

2. The analog front-end circuit of claim 1, wherein the first terminal is coupled to the first input end and the fifth capacitor, and the second terminal is coupled to the first resistor, the second capacitor, and the third capacitor.

3. The analog front-end circuit of claim 2, wherein a capacitance of the fifth capacitor is between 0.1 pF and 5 pF, and a capacitance of the sixth capacitor is between 0.1 pF and 5 pF.

4. The analog front-end circuit of claim 2, wherein a capacitance ratio of the fifth capacitor and the sixth capacitor is between 0.1 and 5.

5. The analog front-end circuit of claim 1, wherein a capacitance of the first capacitor is between 1 pF and 200 pF, and a capacitance of the second capacitor is between 50 fF and 5 pF.

6. An analog front-end circuit, comprising:
- a reference voltage source;
- a first capacitor coupled to the reference voltage source through a switch;
- an amplifier, comprising:
  - a first input end receiving a touch sensing signal from a touch sensor;
  - a second input end receiving a reference signal from the first capacitor; and
- an output end outputting an output signal;
- a second capacitor disposed between the first input end and the second input end;
- a third capacitor disposed between the first input end and the touch sensor;
- a fourth capacitor disposed between the first input end and a display panel;
- a first resistor disposed between the output end and the third capacitor;
- a second resistor disposed between the first input end and the output end, wherein the first resistor and the second resistor are two different resistors; and
- a third resistor comprising a first terminal coupled to the first input end and the second resistor and a second terminal coupled to all of the first resistor, the second capacitor, the third capacitor, and the fourth capacitor, wherein the third resistor is located between the first resistor and the second resistor.

7. The analog front-end circuit of claim 6, wherein the first terminal is coupled to the first input end and the second resistor, and the second terminal is coupled to the first resistor, the second capacitor, and the third capacitor.

8. The analog front-end circuit of claim 7, wherein a resistance of the second resistor is between 200 ohms and 4000 ohms, and a resistance of the third resistor is between 200 ohms and 4000 ohms.

9. The analog front-end circuit of claim 7, wherein a resistance ratio of the second resistor and the third resistor is between 0.1 and 5.

10. The analog front-end circuit of claim 1, further comprising:
- an integrator circuit comprising:
  - a first integrator input end coupled to the output end of the amplifier;
  - a second integrator input end coupled to the reference voltage source; and
  - an integrator output end.

11. The analog front-end circuit of claim 10, further comprising:
- a fourth resistor disposed between the first integrator input end and the output end of the amplifier; and
- a seventh capacitor disposed between the first integrator input end and the integrator output end.

12. A touch sensing circuit, comprising:
- an analog front-end circuit, comprising:
  - a reference voltage source;
  - a first capacitor coupled to the reference voltage source through a switch;
  - an amplifier, comprising:
    - a first input end receiving a touch sensing signal from a touch sensor;
    - a second input end receiving a reference signal from the first capacitor; and
    - an output end outputting an output signal;
  - a second capacitor disposed between the first input end and the second input end;
  - a third capacitor disposed between the first input end and the touch sensor;
  - a fourth capacitor disposed between the first input end and a display panel;
  - a fifth capacitor disposed between the first input end and the output end;
  - a sixth capacitor comprising a first terminal coupled to the first input end and the fifth capacitor and a second terminal coupled to all of a first resistor, the second capacitor, the third capacitor, and the fourth capacitor; and
  - the first resistor disposed between the output end and the third capacitor; and
- an integrator circuit, comprising:
  - a first integrator input end coupled to the output end of the amplifier;
  - a second integrator input end coupled to the reference voltage source; and
  - an integrator output end.

13. The touch sensing circuit of claim 12, wherein the first terminal is coupled to the first input end and the fourth capacitor, and the second terminal is coupled to the first resistor, the second capacitor, and the third capacitor.

14. The touch sensing circuit of claim 12, wherein the integrator circuit further comprises:
- a fourth resistor disposed between the first integrator input end and the output end of the amplifier; and
- a seventh capacitor disposed between the first integrator input end and the integrator output end.

15. The analog front-end circuit of claim 1, wherein the first resistor comprises a third terminal coupled to the output end and the fifth capacitor and a fourth terminal coupled to all of the second capacitor, the third capacitor, the fourth capacitor, and the sixth capacitor.

16. The analog front-end circuit of claim 1, wherein the second capacitor is between the second terminal and the second input end.

17. The analog front-end circuit of claim 1, wherein the third capacitor is between the second terminal and the touch sensor.

18. The analog front-end circuit of claim 1, wherein the fourth capacitor is between the second terminal and the display panel.

19. The analog front-end circuit of claim 6, wherein the first resistor comprises a third terminal coupled to the output end and the first resistor and a fourth terminal coupled to all of the second capacitor, the third capacitor, the fourth capacitor, and the third resistor.

20. The analog front-end circuit of claim 6, wherein the second capacitor is between the second terminal and the second input end.

* * * * *